(12) United States Patent
Nakao

(10) Patent No.: US 8,058,684 B2
(45) Date of Patent: Nov. 15, 2011

(54) SEMICONDUCTOR DEVICE AND METHOD FOR MANUFACTURING THE SAME

(75) Inventor: Yuichi Nakao, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 310 days.

(21) Appl. No.: 12/232,221

(22) Filed: Sep. 12, 2008

(65) Prior Publication Data
US 2009/0072305 A1    Mar. 19, 2009

(30) Foreign Application Priority Data

Sep. 13, 2007  (JP) ................................ 2007-238180
Sep. 14, 2007  (JP) ................................ 2007-238879

(51) Int. Cl.
*H01L 29/66* (2006.01)
(52) U.S. Cl. ............ 257/330; 257/E29.26; 257/E29.201
(58) Field of Classification Search .................. 257/330, 257/E29.26, E29.201
See application file for complete search history.

(56) References Cited

U.S. PATENT DOCUMENTS

2002/0100934 A1    8/2002  Nakagawa et al.
2006/0273379 A1*  12/2006  Bhalla et al. .................. 257/330

FOREIGN PATENT DOCUMENTS

JP        2002-305305       10/2002

* cited by examiner

*Primary Examiner* — Stephen W Smoot
*Assistant Examiner* — Vicki B Booker
(74) *Attorney, Agent, or Firm* — Rabin & Berdo, P.C.

(57) ABSTRACT

A semiconductor device according to the present invention includes: a semiconductor layer made of silicon; a trench formed by digging in from a top surface of the semiconductor layer; a gate insulating film formed on an inner wall surface of the trench and made of silicon oxide; a gate electrode embedded in the trench via the gate insulating film and made of a polysilicon doped with an impurity; and an oxidation-resistant metal film disposed on a top surface of the gate electrode and covering the top surface.

24 Claims, 14 Drawing Sheets

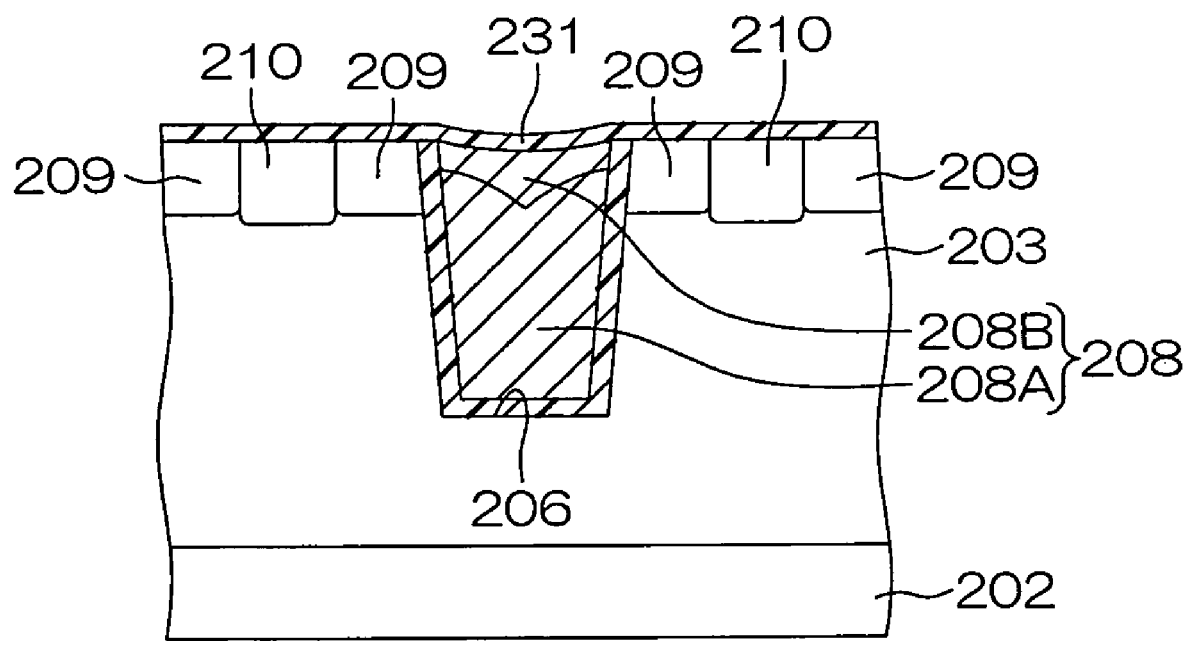

SEMICONDUCTOR DEVICE AND METHOD FOR MANUFACTURING THE SAME

BACKGROUND OF THE INVENTION

1. Field of the Invention

The present invention relates to a semiconductor device, having a vertical double diffused metal oxide semiconductor transistor having a trench gate structure, and a method for manufacturing the same.

2. Description of Related Art

A trench gate structure is generally known as an effective structure for refining a vertical double diffused metal oxide semiconductor field effect transistor (VDMOSFET).

FIG. 5 is a schematic sectional view of a conventional semiconductor device including a trench gate VDMOSFET.

A semiconductor device 101 includes an $N^+$ (high concentration N) substrate 102. An $N^-$ (low concentration N) epitaxial layer 103 is laminated onto the $N^+$ substrate 102. A base layer portion of the $N^-$ epitaxial layer 103 is an $N^-$ region 104, and at a top layer portion of the $N^-$ epitaxial layer 103, a $P^-$ body region 105 is formed vertically adjacent to the $N^-$ region 104.

A trench 106 is formed by digging in from a top surface of the $N^-$ epitaxial layer 103. The trench 106 penetrates through the $P^-$ body region 105, and a deepest portion thereof reaches the $N^-$ region 104. Inside the trench 106, a gate insulating film 107 made of $SiO_2$ (silicon oxide) is formed so as to cover an inner surface thereof. A gate electrode 108 made of a polysilicon (doped polysilicon) doped with a high concentration of an N impurity is embedded at an inner side of the gate insulating film 107.

On top layer portions of the $P^-$ body region 105, $N^+$ source regions 109 are formed along the trench 106. Further, on top layer portions of the $P^-$ body region 105, $P^+$ body contact regions 110 are formed so as to penetrate through the $N^+$ source regions 109.

An interlayer insulating film 113 is laminated onto the $N^-$ epitaxial layer 103. A gate wiring 114 is formed on the interlayer insulating film 113. The gate wiring 114 is contacted (electrically connected) to the gate electrode 108 via a contact hole 115 formed in the interlayer insulating film 113. A source wiring 116 is electrically connected to the $N^+$ source regions 109 and the body contact regions 110 via contact holes (not shown) formed in the interlayer insulating film 113.

A drain electrode 117 is formed on a rear surface of the $N^+$ substrate 102.

In a process of manufacturing the semiconductor device 101, a silicon oxide film is formed on the top surface of the $N^-$ epitaxial layer 103, including the inner surface of the trench 106, and a deposition layer of the doped polysilicon is formed on the silicon oxide film. The doped polysilicon deposition layer fills the interior of the trench 106 completely and is formed to a thickness covering the silicon oxide film outside the trench 106. Thereafter, by etch back, the portion of the doped polysilicon deposition layer present outside the trench 106 is removed, and the gate electrode 108 made of the doped polysilicon is formed inside the trench 106.

After the gate electrode 108 is thus formed, a cleaning process for cleaning the top surface of the $N^-$ epitaxial layer 103 is performed before ion implantation for forming the $N^+$ source regions 109. In this cleaning process, first, HF (hydrofluoric acid) is supplied to the silicon oxide film exposed by etch back of the doped polysilicon, and the portion of the silicon oxide film outside the trench 106 is removed. Then, by a thermal oxidation process, a sacrificial oxide film is formed on a top surface of the gate electrode 108 and the top surface of the $N^-$ epitaxial layer 103. HF is then supplied to the sacrificial oxide film, and the sacrificial oxide film is removed by the HF.

After the cleaning process, the $N^+$ source regions 109 and the body contact regions 110 are formed. Thereafter, by a CVD method, the interlayer insulating film 113 of a predetermined thickness is formed on the $N^-$ epitaxial layer 103. The contact hole 115 is then formed in the interlayer insulating film 113 by photolithography and etching.

However, the doped polysilicon is more readily oxidized (for example, is about three times in oxidation rate) compared to silicon that is not doped with an impurity. Thus, in the cleaning process, the sacrificial oxide film that is thicker than the oxide film formed on the top surface of the $N^-$ epitaxial layer 103 is formed on the top surface of the gate electrode 108. Thus, after removal of the sacrificial oxide film, the top surface of the gate electrode 108 becomes lower than the top surface of the $N^-$ epitaxial layer 103. That is, in the cleaning process, the gate electrode 108 develops a greater film thickness loss than the $N^-$ epitaxial layer 103.

Such film thickness loss of the gate electrode 108 causes variation of height (depth) among gate electrodes 108 (among a plurality of gate electrodes 108 formed on the semiconductor device 101 and/or among respective gate electrodes 108 of a plurality of semiconductor devices 101). Variation of height among gate electrodes 108 may cause variation of transistor characteristics. Further, when the top surface of the gate electrode 108 becomes excessively lower than the top surfaces of the $N^+$ source regions 109 ($N^-$ epitaxial layer 103), desired transistor characteristics may not be exhibited.

Still further, when the top surface of the gate electrode 108 becomes lower than the top surface of the $N^-$ epitaxial layer 103, the interlayer insulating film 113 partially increases in thickness on the gate electrode 108. Thus, when the contact hole 115 for contact with the gate electrode 108 and the contact holes for contact with the $N^+$ source regions 109 are formed simultaneously in the interlayer insulating film 113, the contact hole 115 may not penetrate through the interlayer insulating film 113 as shown in FIG. 5 and a contact failure may be caused between the gate electrode 108 and the gate wiring 114.

Yet further, during forming of the gate electrode 108, the doped polysilicon deposition layer grows from the top surface of the $N^-$ epitaxial layer 103 including the inner surface of the trench 106. On the surface of the doped polysilicon deposition layer, a recess recessed toward the trench 106 is thus formed at a position opposing to the trench 106. As etch back of the doped polysilicon deposition layer progresses, the recess in the top surface of the doped silicon deposition layer increases, and a recess is finally left in the top surface of the gate electrode 108. Due to both the recess and the film thickness loss of the gate electrode 108 during the cleaning process, when the thickness of the portion of the interlayer insulating film 113 on the gate electrode 108 increases more, it is more likely to cause a contact failure between the gate electrode 108 and the gate wiring 114.

SUMMARY OF THE INVENTION

An object of the present invention is to provide a semiconductor device and a method for manufacturing the same, with which stable transistor characteristics can be exhibited and occurrence of a contact failure between a gate electrode and a gate wiring can be prevented.

A semiconductor device according to one aspect of the present invention includes: a semiconductor layer made of silicon; a trench formed by digging in from a top surface of the semiconductor layer; a gate insulating film formed on an inner wall surface of the trench and made of silicon oxide; a gate electrode embedded in the trench via the gate insulating film and made of a polysilicon doped with an impurity (doped polysilicon); and an oxidation-resistant metal film disposed on a top surface of the gate electrode and covering the top surface.

With this configuration, the gate electrode made of the doped polysilicon is embedded via the gate insulating film in the trench formed in the semiconductor layer. The top surface of the gate electrode is coated by the oxidation-resistant metal film. Because a sacrificial oxide film is thus not formed on the top surface of the gate electrode during a cleaning process after formation of the gate electrode, film thickness loss of the gate electrode can be prevented. Consequently, the top surface of the gate electrode can be prevented from being lower than the top surface of the semiconductor layer. The semiconductor device can thus exhibit stable transistor characteristics without variation among transistors. Occurrence of a contact failure between the gate electrode and a gate wiring can also be prevented.

A semiconductor device according to another aspect of the present invention includes: a semiconductor layer made of silicon; a trench formed by digging in from a top surface of the semiconductor layer; a gate insulating film formed on an inner wall surface of the trench and made of silicon oxide; and a gate electrode embedded in the trench via the gate insulating film; and the gate electrode includes a high concentration portion having a relatively high impurity concentration, and a low concentration portion formed on the high concentration portion and having a relatively low impurity concentration.

A semiconductor device having such a structure can be manufactured by the following manufacturing method.

The manufacturing method includes the steps of: forming a trench in a semiconductor layer made of silicon; forming an oxide film on a top surface of the semiconductor layer including an inner surface of the trench; forming a doped polysilicon layer made of a polysilicon doped with an impurity and having a thickness filling the trench completely on the oxide film; etching back the doped polysilicon layer to remove a portion of the doped polysilicon layer outside the trench and leave a portion of the doped polysilicon at a bottom portion inside the trench; laminating a non-doped polysilicon layer made of a polysilicon not doped with an impurity and having a thickness filling the trench completely on the oxide film and the doped polysilicon layer after etch back of the doped polysilicon layer; etching back the non-doped polysilicon layer to remove a portion of the non-doped polysilicon layer outside the trench and leave a portion of the non-doped polysilicon on the doped polysilicon layer inside the trench; removing a portion of the oxide film outside the trench; forming a sacrificial oxide film once on a top surface of the semiconductor layer exposed by removal of the oxide film, and a top surface of the non-doped polysilicon layer and then removing the sacrificial oxide film to clean the top surface of the semiconductor layer and the top surface of the non-doped polysilicon layer; and implanting an impurity into the non-doped polysilicon layer inside the trench after the cleaning.

After the doped polysilicon layer and the non-doped polysilicon layer are successively embedded in the trench formed in the semiconductor layer, the respective top surfaces of the semiconductor layer and the non-doped polysilicon are cleaned. That is, the sacrificial oxide film is formed on the respective top surfaces of the semiconductor layer and the non-doped polysilicon, and then the sacrificial oxide film is removed. Because an oxidation rate of the non-doped polysilicon and an oxidation rate of silicon are substantially equal, the sacrificial oxide film formed on the top surface of the non-doped polysilicon layer has substantially the same thickness as the sacrificial oxide film formed on the top surface of the semiconductor layer. Thus, by removal of the sacrificial oxide film, the non-doped polysilicon layer develops film thickness loss of substantially the same thickness as the semiconductor loss. Thus, a top surface of the gate electrode made of the doped polysilicon layer and the non-doped polysilicon layer is secure form being lower than the top surface of the semiconductor layer. The semiconductor device can thus exhibit stable transistor characteristics without variation among transistors. The occurrence of a contact failure between the gate electrode and the gate wiring can also be prevented.

Further, to embed the doped polysilicon layer in the trench, the doped polysilicon layer is formed to the thickness filling the trench completely and thereafter, the doped polysilicon layer is etched back. The doped polysilicon layer thereby remains at the bottom portion inside the trench, and a recess is formed in the top surface of the doped polysilicon layer. Thereafter, the non-doped polysilicon layer of the thickness that completely fills the trench is formed and then the non-doped polysilicon layer is etched back. No recess is formed in the top surface of the non-doped polysilicon layer, or even if a recess corresponding to the recess in the top surface of the doped polysilicon layer is formed, the recess is smaller than the recess in the top surface of the doped polysilicon layer. A large recess is thus not formed in the surface of the non-doped polysilicon layer after etch back. Because the top surface of the gate electrode made of the doped polysilicon layer and the non-doped polysilicon layer can thus be formed to be substantially flat, occurrence of a contact failure between the gate electrode and the gate wiring can be further prevented.

The foregoing and other objects, features, and effects of the present invention will become more apparent from the following detailed description of the embodiments with reference to the attached drawings.

BRIEF DESCRIPTION OF THE DRAWINGS

FIG. 4P is a schematic sectional view of a step subsequent to that of FIG. 4O.

DETAILED DESCRIPTION OF PREFERRED EMBODIMENTS

Embodiments of the present invention shall now be described in detail with reference to the attached drawings.

Figure 1:
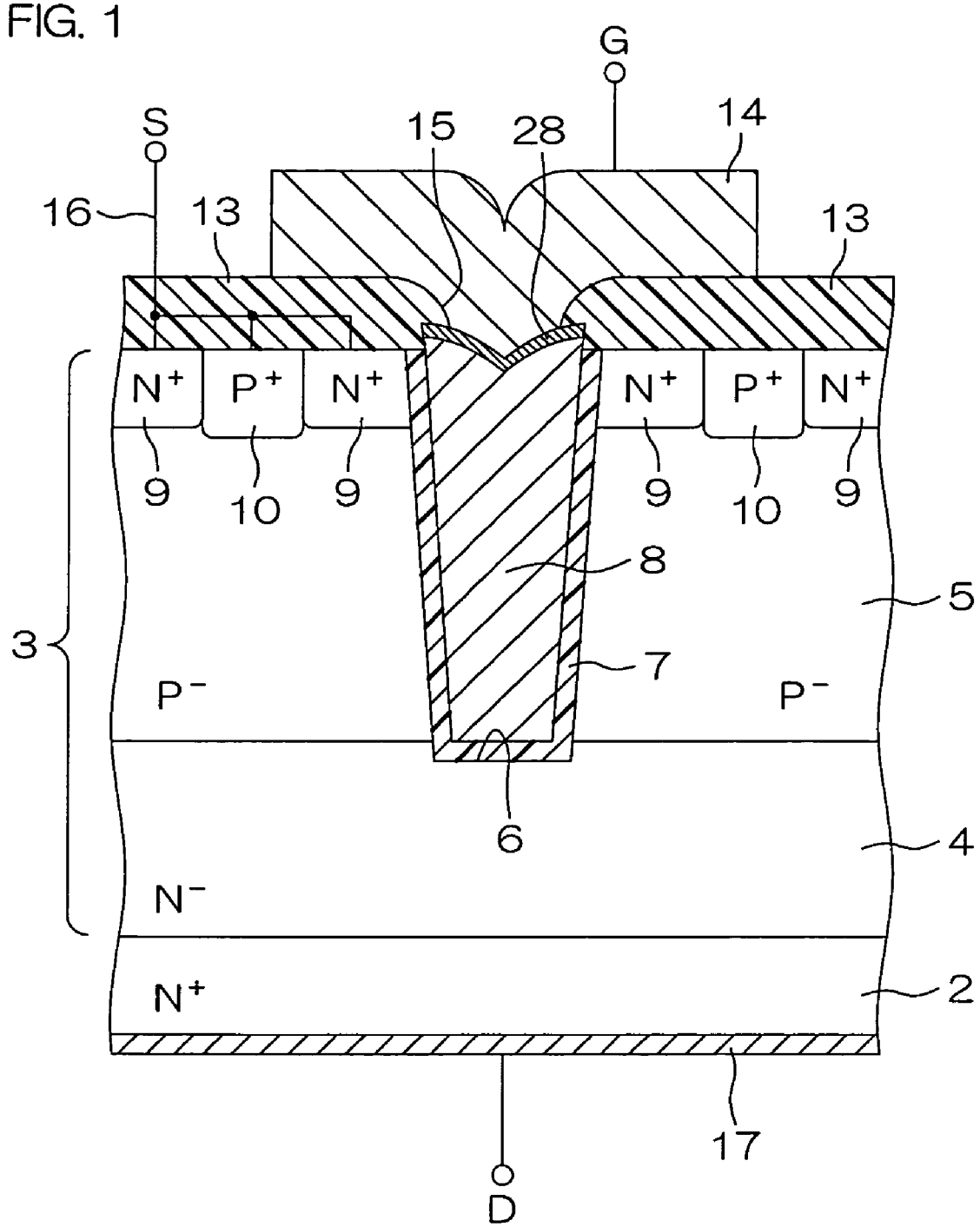
FIG. 1 is a schematic sectional view of a structure of a semiconductor device according to a first embodiment of the present invention.

FIG. 1 is a schematic sectional view of a structure of a semiconductor device according to a first embodiment of the present invention.

A semiconductor device 1 has an array structure, in which unit cells, each having a trench gate VDMOSFET, are disposed in a matrix.

An $N^-$ epitaxial layer 3 is laminated as a semiconductor layer on an $N^+$ substrate 2 to form a base of the semiconductor device 1. The epitaxial layer 3 is made of silicon doped with a lower concentration (for example, of $10^{15}$ to $10^{16}/cm^3$) of an N impurity than that of the $N^+$ substrate 2. A base layer portion of the epitaxial layer 3 is maintained in a state after epitaxial growth and constitutes an $N^-$ region 4. In the epitaxial layer 3, a $P^-$ body region 5 is formed on the $N^-$ region 4 and in contact with the $N^-$ region 4.

A trench 6 is formed by digging in from the top surface of the epitaxial layer 3. The trench 6 penetrates through the body region 5 and a deepest portion thereof reaches the $N^-$ region 4. The trench 6 is formed in plurality, with each being spaced apart at a fixed interval in a right/left direction and extending in a direction orthogonal to a surface of FIG. 1 (direction along a gate width). Inside each trench 6, a gate insulating film 7 made of $SiO_2$ is formed so as cover an entire inner surface thereof. By filling an inner side of the gate insulating film 7 with a polysilicon (doped polysilicon) doped with a high concentration of an N impurity, a gate electrode 8 is embedded inside the trench 6. On a top surface of the gate electrode 8, a W (tungsten) film 28 having an oxidation resisting property is disposed as a metal film.

On a top layer portion of the epitaxial layer 3, $N^+$ source regions 9 are formed at both sides of the trench 6 in a direction orthogonal to the gate width (right/left direction in FIG. 1). Each source region 9 has an N impurity concentration (for example of $10^{19}/cm^3$) that is higher than the N impurity concentration of the $N^-$ region 4. Each source region 9 extends in the direction along the gate width along the trench 6 and a bottom portion thereof contacts the body region 5. At a central region of the source region 9 in the direction orthogonal to the gate width, a $P^+$ body contact region 10 is formed so as to penetrate through the source region 9.

That is, the trenches 6 and the source regions 9 are disposed alternately in the direction orthogonal to the gate width and individually extend in the direction along the gate width. On the source region 9, a boundary between unit cells adjacent in the direction orthogonal to the gate width is set along the source region 9. At least one body contact region 10 is provided across two unit cells adjacent in the direction orthogonal to the gate width. A boundary between unit cells adjacent in the direction along the gate width is set so that the gate electrode 8 contained in each unit cell has a fixed gate width.

An interlayer insulating film 13 is laminated on the epitaxial layer 3. A gate wiring 14 is formed on the interlayer insulating film 13. The gate wiring 14 is put in contact with the gate electrode 8 via a contact hole 15 formed so as to penetrate through the interlayer insulating film 13 in the up/down direction. A source wiring 16 is electrically connected to the source regions 9 and the body contact regions 10 via contact holes (not shown) formed in the interlayer insulating layer 13. The source wiring 16 is grounded.

A drain electrode 17 is formed on a rear surface of the $N^+$ substrate 2.

By controlling a potential of the gate electrode 8 while applying a positive voltage of a suitable magnitude to the drain electrode 17, a channel can be formed near an interface of the gate insulating film 7 in the body region 5 to flow a current between the source region 9 and the drain electrode 17.

Figure 2A:
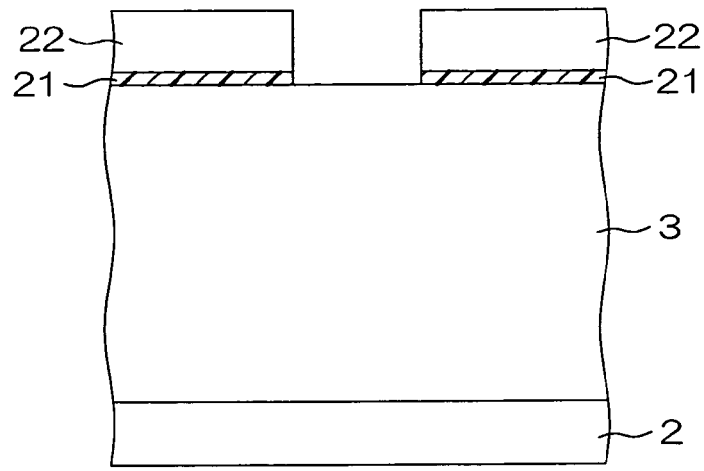
FIG. 2A is a schematic sectional view for describing a method for manufacturing the semiconductor device shown in FIG. 1.
Figure 2B:
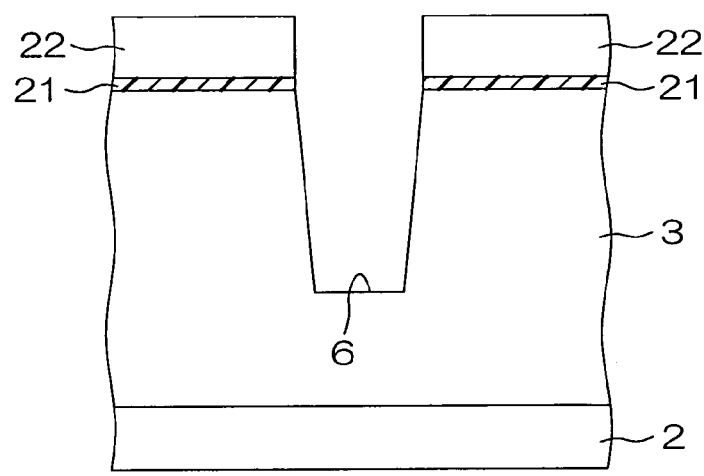
FIG. 2B is a schematic sectional view of a step subsequent to that of FIG. 2A.
Figure 2C:
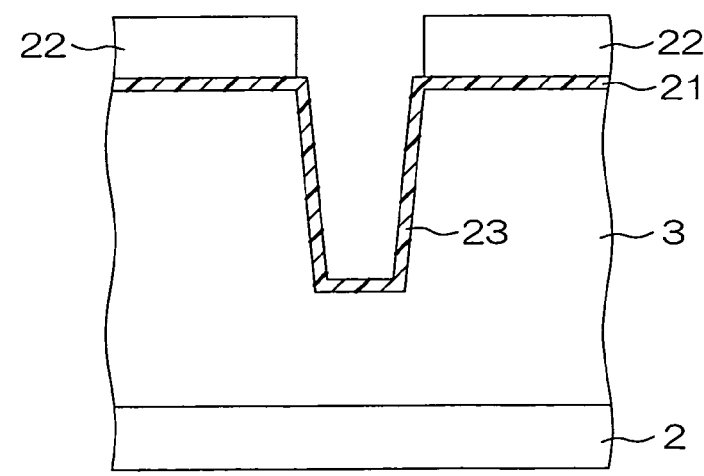
FIG. 2C is a schematic sectional view of a step subsequent to that of FIG. 2B.
Figure 2D:
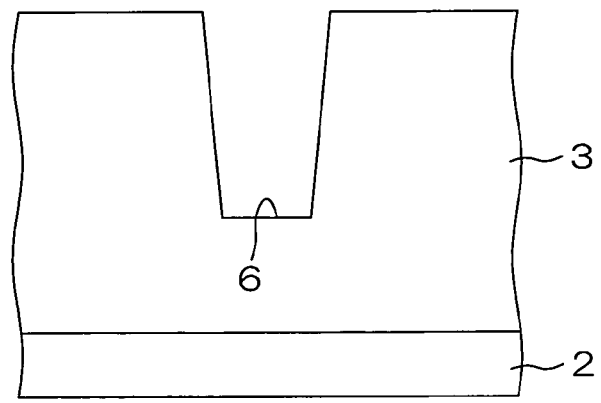
FIG. 2D is a schematic sectional view of a step subsequent to that of FIG. 2C.
Figure 2E:
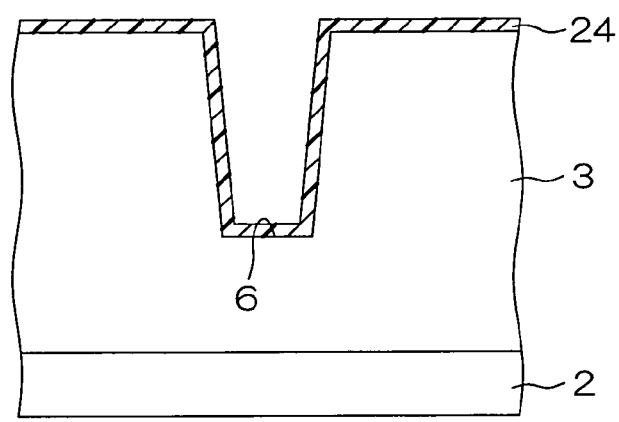
FIG. 2E is a schematic sectional view of a step subsequent to that of FIG. 2D.
Figure 2F:
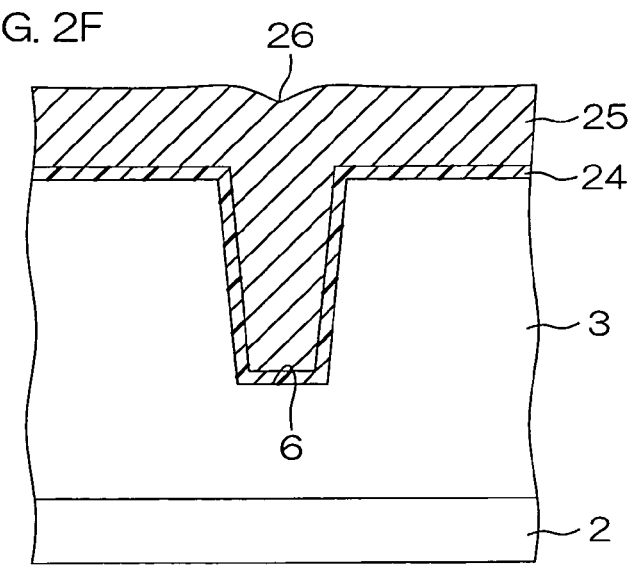
FIG. 2F is a schematic sectional view of a step subsequent to that of FIG. 2E.
Figure 2G:
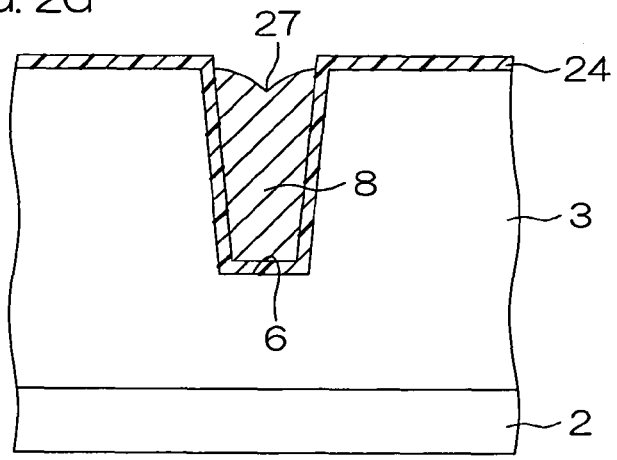
FIG. 2G is a schematic sectional view of a step subsequent to that of FIG. 2F.
Figure 2H:
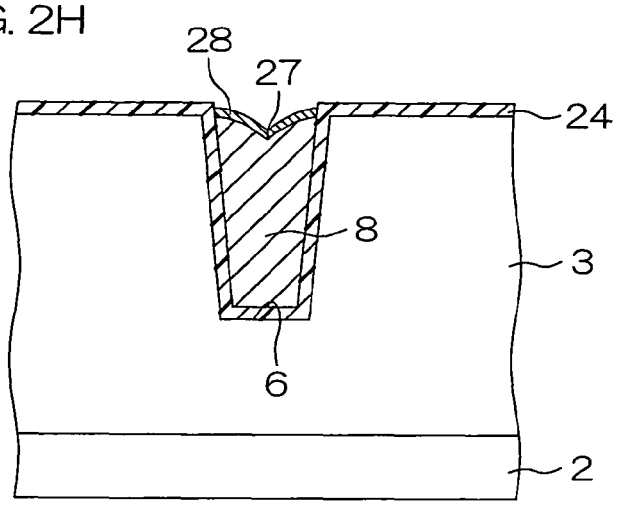
FIG. 2H is a schematic sectional view of a step subsequent to that of FIG. 2G.
Figure 2I:
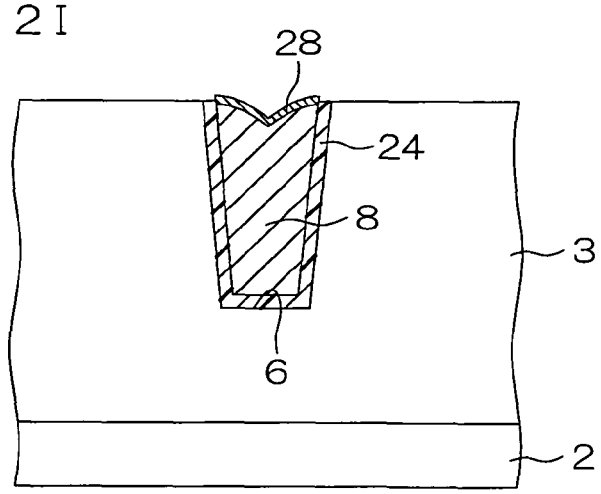
FIG. 2I is a schematic sectional view of a step subsequent to that of FIG. 2H.
Figure 2J:
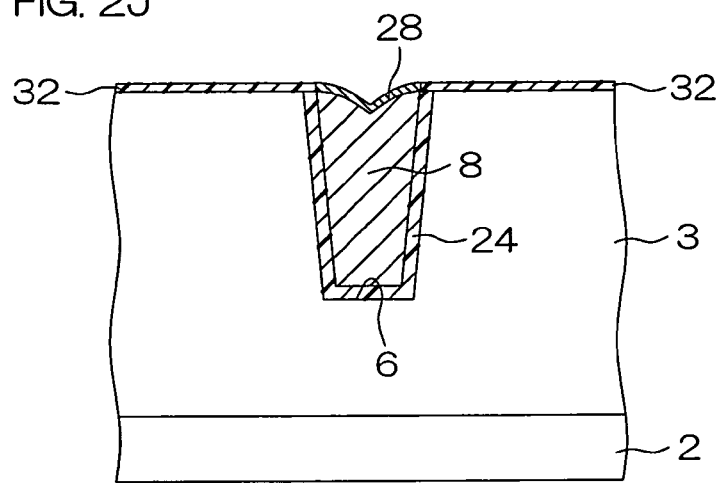
FIG. 2J is a schematic sectional view of a step subsequent to that of FIG. 2I.
Figure 2K:
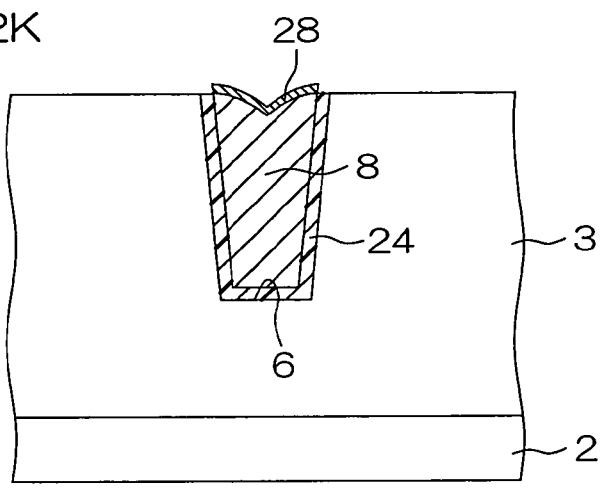
FIG. 2K is a schematic sectional view of a step subsequent to that of FIG. 2J.
Figure 2L:
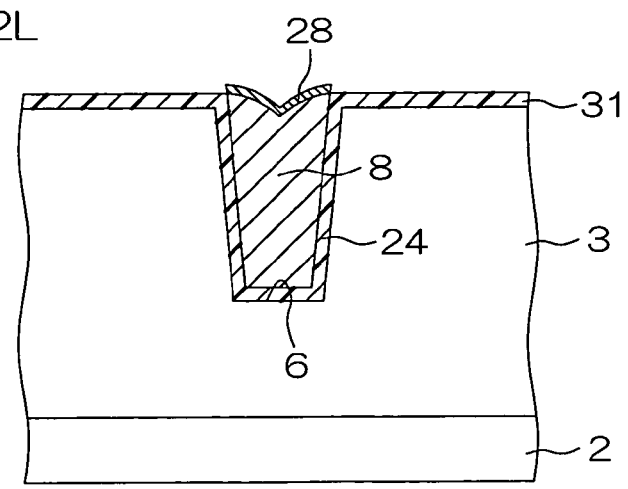
FIG. 2L is a schematic sectional view of a step subsequent to that of FIG. 2K.
Figure 2M:
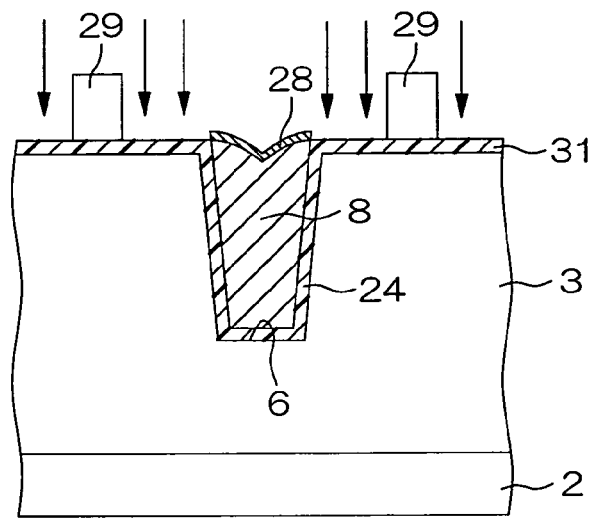
FIG. 2M is a schematic sectional view of a step subsequent to that of FIG. 2L.
Figure 2N:
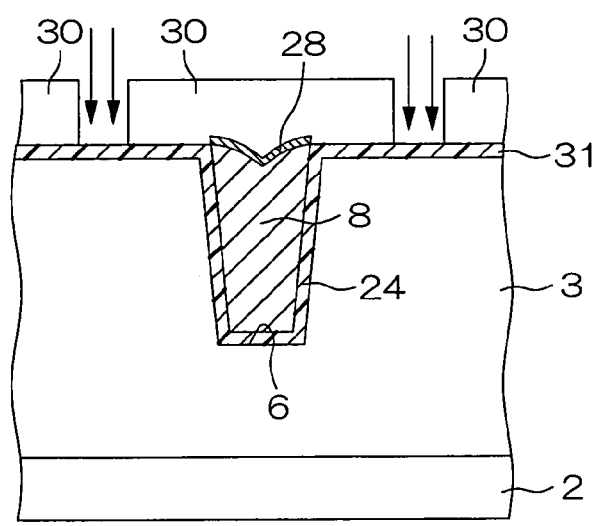
FIG. 2N is a schematic sectional view of a step subsequent to that of FIG. 2M.
Figure 2O:
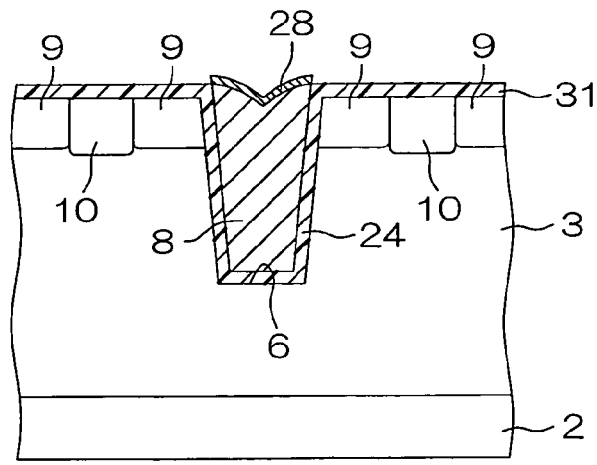
FIG. 2O is a schematic sectional view of a step subsequent to that of FIG. 2N.

FIGS. 2A to 2O are schematic sectional views for describing a method for manufacturing the semiconductor device 1 according to successive steps.

First, as shown in FIG. 2A, the epitaxial layer 3 is formed on the $N^+$ substrate 2 by an epitaxial growth method. Then, by a thermal oxidation process, a sacrificial oxide film 21 made of $SiO_2$ is formed on the top surface of the epitaxial layer 3. Thereafter, by P-CVD (Plasma Chemical Vapor Deposition) or LP-CVD (Low Pressure Chemical Vapor Deposition), an SiN (Silicon Nitride) film 22 is formed on the sacrificial oxide film 21. By patterning the SiN layer 22 and the sacrificial oxide film 21 by etching, then a hard mask is formed, having an opening at a portion opposing to a portion where the trench 6 is to be formed. Then, as shown in FIG. 2B, the epitaxial layer 3 is etched using the hard mask to form the trench 6.

Then, as shown in FIG. 2C, by performing a thermal oxidation process while the hard mask (SiN layer 22) is left on the sacrificial oxide film 21, a sacrificial oxide film 23 made of $SiO_2$ is formed on the inner surface of the trench 6.

Thereafter, as shown in FIG. 2D, the SiN layer 22 is removed. Furthermore, the sacrificial oxide films 21 and 23 are removed. The top surface of the epitaxial layer 3 and the inner surface of the trench 6 are thereby exposed.

Then, as shown in FIG. 2E, an oxide film 24 made of $SiO_2$ is formed on the top surface of the epitaxial layer 3 and the inner surface of the trench 6 by a thermal oxidation process.

Then, by a CVD method, a deposition layer 25 of a doped polysilicon is formed on the oxide film 24. As shown in FIG. 2F, the doped polysilicon deposition layer 25 completely fills the interior of the trench 6 and is also formed on the oxide film 24 outside the trench 6. Because the trench 6 is formed by digging in from the top surface of the epitaxial layer 3, a recess 26 is formed in a top surface of the doped polysilicon deposition layer 25 at a position opposing to the trench 6.

A portion of the doped polysilicon deposition layer 25 that is present outside the trench 6 is thereafter removed by etch back. The top surface (etched back surface) of the doped polysilicon deposition layer 25 is thereby substantially flush with the top surface of the epitaxial layer 3 and the gate electrode 8 made of the doped polysilicon is thereby obtained inside the trench 6 as shown in FIG. 2G. Due to the recess 26 formed on the top surface of the deposition layer 25, a recess 27 is formed on the top surface of the gate electrode 8.

After etch back, the W film 28 is formed on the top surface of the gate electrode 8 by a CVD method as shown in FIG. 2H. The top surface of the gate electrode 8 is covered by the W film 28.

Thereafter, as shown in FIG. 2I, the oxide film 24 is removed from the top surface of the epitaxial layer 3 by etching. The top surface of the epitaxial layer 3 is thereby exposed.

Then, as shown in FIG. 2J, a sacrificial oxide film 32 made of $SiO_2$ is formed on the top surface of the epitaxial layer 3 by a thermal oxidation process. Here, because the top surface of the gate electrode 8 is covered by the W film 28 having an oxidation resisting property, the sacrificial oxide film 32 is not formed on the gate electrode 8.

Then, as shown in FIG. 2K, the sacrificial oxide film 32 is removed by etching. Cleaning of the top surface of the epitaxial layer 3 is thereby achieved, and the top surface of the epitaxial layer 3 enters a satisfactory state.

Thereafter, as shown in FIG. 2L, an oxide film 31 made of $SiO_2$ is formed on the top surface of the epitaxial layer 3 by a thermal oxidation process.

Then, as shown in FIG. 2M, a mask 29 is formed on the oxide film 31, having openings at portions opposing to portions where the source regions 9 are to be formed. N impurity ions are then implanted onto top layer portions of the epitaxial layer 3 via the openings of the mask 29. After the ion implantation, the mask 29 is removed.

Furthermore, as shown in FIG. 2N, a mask 30 is formed on the oxide film 31, having openings at portions opposing to portions where the body contact regions 10 are to be formed. P impurity ions are then implanted onto top layer portions of the epitaxial layer 3 via the openings of the mask 30. After the ion implantation, the mask 30 is removed.

Thereafter, an annealing process is performed. By the annealing process, the N impurity and P impurity ions implanted onto the top layer portions of the epitaxial layer 3 are activated, and the source regions 9 and the body contact regions 10 are thereby formed at the top layer portions of the epitaxial layer 3 as shown in FIG. 2O.

After the above steps, the oxide film 31 present on the top surface of the epitaxial layer 3 is removed, and only the oxide film 24 is left on the inner surface of the trench 6, so that the gate insulating film 7 is obtained. Thereafter, the interlayer insulating film 13 having a predetermined thickness is formed on the epitaxial layer 3 by a CVD method. Then, after the contact hole 15, etc., are formed in the interlayer insulating film 13 by photolithography and etching, the gate wiring 14, the source wiring 16, and the drain electrode 17 are formed, thereby obtaining the semiconductor device 1 shown in FIG. 1.

As mentioned above, the gate electrode 8 made of doped polysilicon is embedded in the trench 6 formed in the epitaxial layer 3 via the gate insulating film 7. The top surface of the gate electrode 8 is covered with the W film 28 having the oxidation resisting property. Because an oxide film (sacrificial oxide film 32) is thus not formed on the top surface of the gate electrode 8 during the cleaning process (see FIGS. 2J and 2K), etc., after the formation of the gate electrode 8, film thickness loss of the gate electrode 8 can be prevented. Consequently, the top surface of the gate electrode 8 can be prevented from being lower than the top surface of the epitaxial layer 3. The semiconductor device 1 can thus exhibit stable transistor characteristics without variation among transistors. The occurrence of contact failures between the gate electrode 8 and the gate wiring 14 can also be prevented.

A Pt (platinum) film may be employed in place of the W film 28. In this case, a Pt film can be formed on the gate electrode 8 by forming a Pt film on an entire surface of the epitaxial layer 3 including the top surface of the gate electrode 8, and after siliciding a portion of the Pt film in contact with the gate electrode 8, removing the non-silicided portion of the Pt film.

Further, a Co (cobalt) film may be employed in place of the W film 28. In this case, a Co film can be formed on the gate electrode 8 by forming a Co film on an entire surface of the epitaxial layer 3 including the top surface of the gate electrode 8, and selectively removing the Co film by photolithography and etching.

Further, a metal film, such as an Ni (nickel) film, a Ti (titanium) film, a Au (gold) film may be employed in place of the W film 28. In this case, the metal film can be formed on the top surface of the gate electrode 8 by the same method as that employed to form the Co film.

The Pt film may also be formed by the same method as that employed to form the Co film.

Furthermore, a configuration may be employed with which the conduction types of the respective semiconductor portions of the semiconductor device 1 are inverted. That is, in the semiconductor device 1, a P type portion may be replaced by an N type portion and an N type portion may be replaced by a P type portion.

Figure 3:
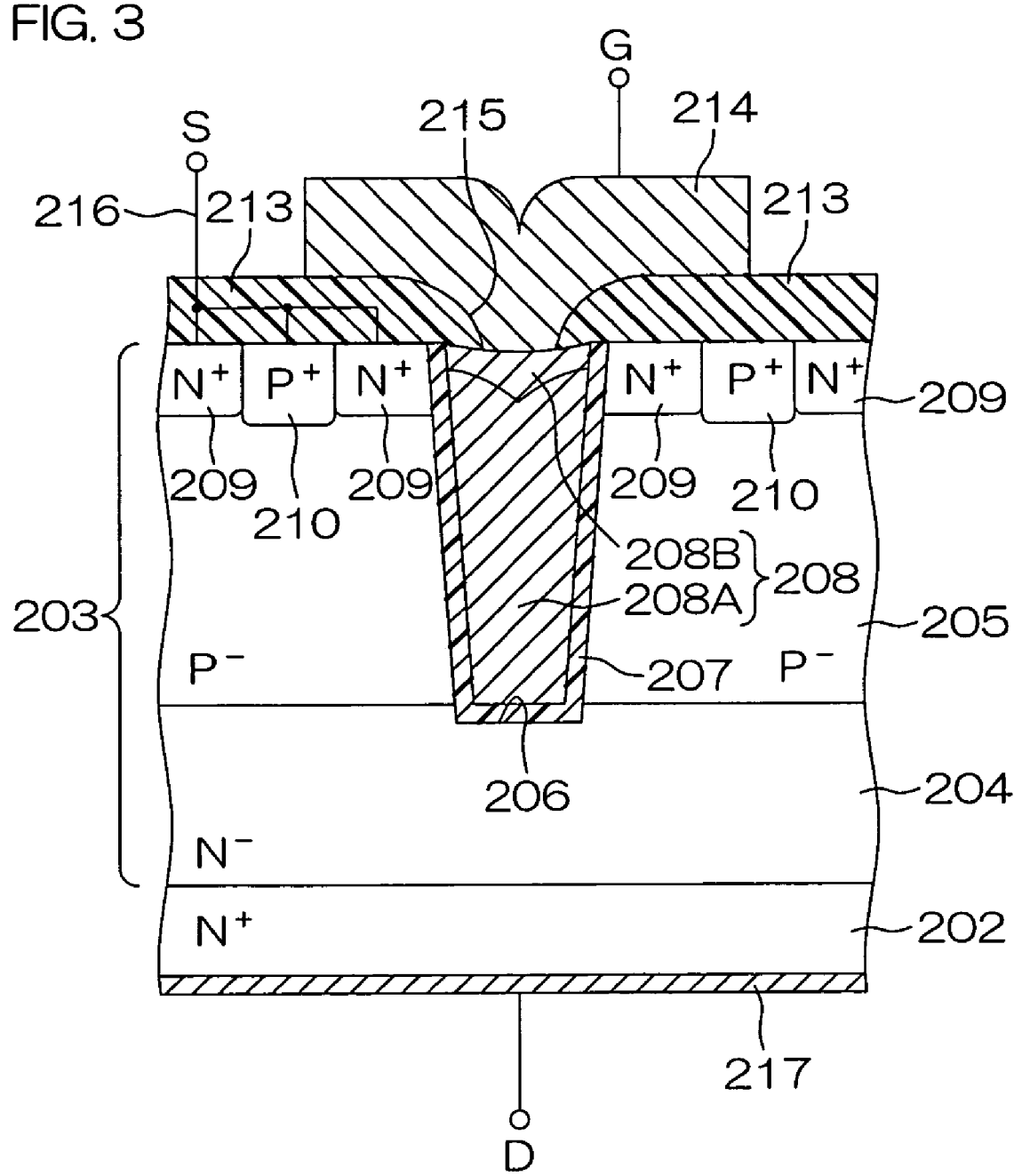
FIG. 3 is a schematic sectional view of a structure of a semiconductor device according to a second embodiment of the present invention.

FIG. 3 is a schematic sectional view of a structure of a semiconductor device according to a second embodiment of the present invention.

A semiconductor device 201 has an array structure, in which unit cells, each having a trench gate VDMOSFET are disposed in a matrix.

An $N^-$ epitaxial layer 203 is laminated as a semiconductor layer on an $N^+$ substrate 202 to form a base of the semiconductor device 201. The epitaxial layer 203 is made of silicon doped with a lower concentration (for example, of $10^{15}$ to $10^{16}/cm^3$) of an N impurity than that of the $N^+$ substrate 202. A base layer portion of the epitaxial layer 203 is maintained in a state after epitaxial growth and constitutes an $N^-$ region 204. In the epitaxial layer 203, a $P^-$ body region 205 is formed on the $N^-$ region 204 and in contact with the $N^-$ region 204.

A trench 206 is formed by digging in from the top surface of the epitaxial layer 203. The trench 206 penetrates through the body region 205 and a deepest portion thereof reaches the N⁻ region 204. The trench 206 is formed in plurality, with each being spaced apart at a fixed interval in a right/left direction in FIG. 3 and extending in a direction orthogonal to a surface of FIG. 3 (direction along a gate width).

Inside each trench 206, a gate insulating film 207 made of $SiO_2$ is formed so as cover an entire inner surface thereof. A gate electrode 208 is embedded in an inner side of the gate insulating film 207 in the trench 206. The gate electrode 208 has a high concentration layer (high concentration portion) 208A doped with a high concentration (for example, $10^{20}/cm^3$) of an N impurity, and a low concentration layer (low concentration portion) 208B doped with the N impurity at a lower concentration (for example, $10^{19}/cm^3$) than the N impurity concentration of the high concentration layer 208A. The high concentration layer 208A is embedded at a bottom portion of the trench 206, and the low concentration layer 208B is formed on the high concentration layer 208A. P (phosphorus) and As (arsenic) can be cited as examples of the N impurity doped in the high concentration layer 208A and the low concentration layer 208B.

On a top layer portion of the epitaxial layer 203, N⁺ source regions 209 are formed at both sides of the trench 206 in a direction orthogonal to the gate width (right/left direction in FIG. 3). Each source region 209 has an N impurity concentration (for example of $10^{19}/cm^3$) that is higher than the N impurity concentration of the N⁻ region 204. Each source region 209 extends in the direction along the gate width along the trench 206 and a bottom portion thereof contacts the body region 205. At a central region of the source region 209 in the direction orthogonal to the gate width, a P⁺ body contact region 210 is formed so as to penetrate through the source region 209.

That is, the trenches 206 and the source regions 209 are disposed alternately in the direction orthogonal to the gate width and individually extend in the direction along the gate width. On the source region 209, a boundary between unit cells adjacent in the direction orthogonal to the gate width is set along the source region 209. At least one body contact region 210 is provided across two unit cells adjacent in the direction orthogonal to the gate width. A boundary between unit cells adjacent in the direction along the gate width is set so that the gate electrode 208 contained in each unit cell has a fixed gate width.

An interlayer insulating film 213 is laminated on the epitaxial layer 203. A gate wiring 214 is formed on the interlayer insulating film 213. The gate wiring 214 is put in contact with the gate electrode 208 via a contact hole 215 formed so as to penetrate through the interlayer insulating film 213 in the up/down direction. A source wiring 216 is electrically connected to the source regions 209 and the body contact regions 210 via contact holes (not shown) formed in the interlayer insulating layer 213. The source wiring 216 is grounded.

A drain electrode 217 is formed on a rear surface of the N⁺ substrate 202.

By controlling a potential of the gate electrode 208 while applying a positive voltage of a suitable magnitude to the drain electrode 217, a channel can be formed near an interface of the gate insulating film 207 in the body region 205 to flow a current between the source region 209 and the drain electrode 217.

Figure 4A:
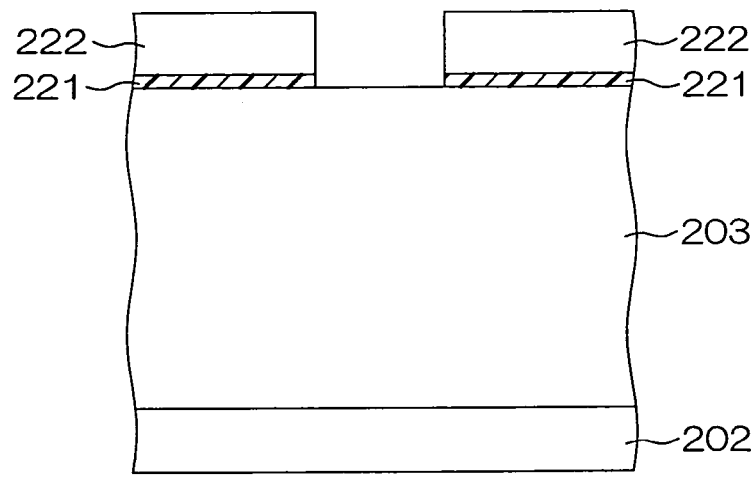
FIG. 4A is a schematic sectional view for describing a method for manufacturing the semiconductor device shown in FIG. 3.

FIGS. 4A to 4P are schematic sectional views for describing a method for manufacturing the semiconductor device 201 according to successive steps.

First, as shown in FIG. 4A, the epitaxial layer 203 is formed on the N⁺ substrate 202 by an epitaxial growth method. Then, by a thermal oxidation process, a sacrificial oxide film 221 made of $SiO_2$ is formed on the top surface of the epitaxial layer 203. Thereafter, by P-CVD (Plasma Chemical Vapor Deposition) or LP-CVD (Low Pressure Chemical Vapor Deposition), an SiN (Silicon Nitride) film 222 is formed on the sacrificial oxide film 221. The SiN layer 222 and the sacrificial oxide film 221 are then patterned by photolithography and etching. A hard mask is thereby formed having an opening at a portion opposing to a portion where the trench 206 is to be formed.

Figure 4B:
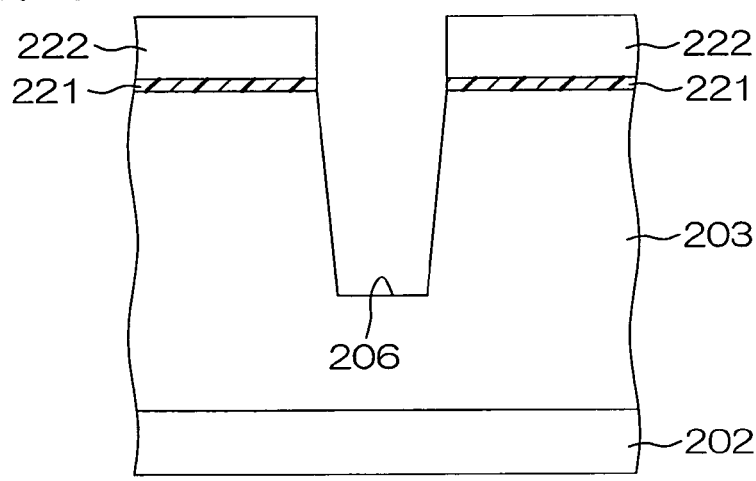
FIG. 4B is a schematic sectional view of a step subsequent to that of FIG. 4A.

Thereafter, as shown in FIG. 4B, the epitaxial layer 203 is etched using the hard mask to form the trench 206.

Figure 4C:
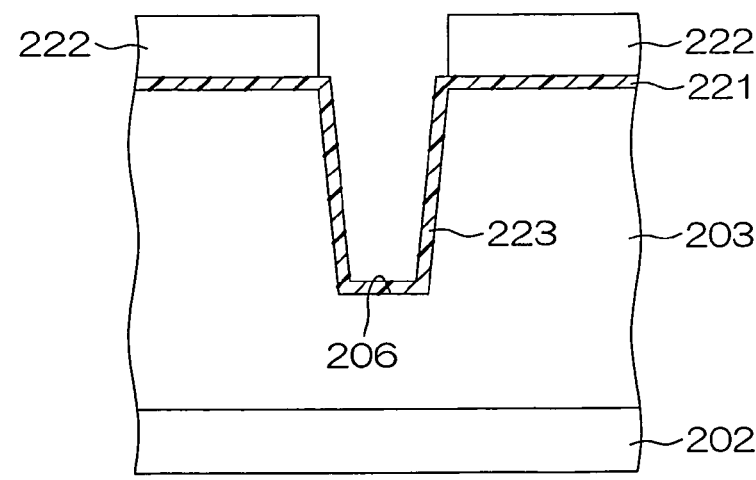
FIG. 4C is a schematic sectional view of a step subsequent to that of FIG. 4B.

Then, as shown in FIG. 4C, by performing a thermal oxidation process while the SiN layer 222 is left on the sacrificial oxide film 221, a sacrificial oxide film 223 made of $SiO_2$ is formed on the inner surface of the trench 206.

Figure 4D:
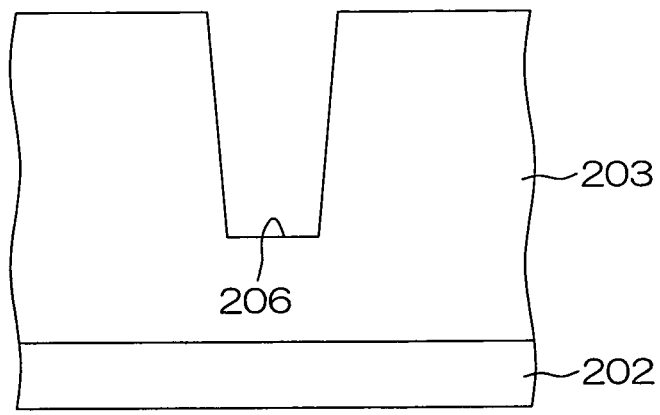
FIG. 4D is a schematic sectional view of a step subsequent to that of FIG. 4C.

Thereafter, as shown in FIG. 4D, the SiN layer 222 is removed. Furthermore, the sacrificial oxide films 221 and 223 are removed. The top surface of the epitaxial layer 203 and the inner surface of the trench 206 are thereby exposed.

Figure 4E:
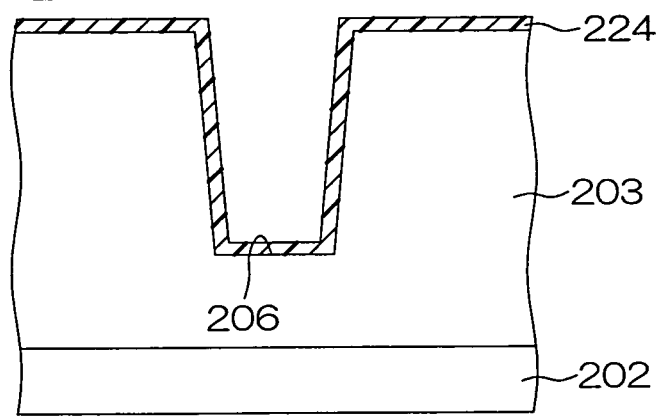
FIG. 4E is a schematic sectional view of a step subsequent to that of FIG. 4D.

Then, as shown in FIG. 4E, an oxide film 224 made of $SiO_2$ is formed on the top surface of the epitaxial layer 203 and the inner surface of the trench 206 by a thermal oxidation process.

Figure 4F:
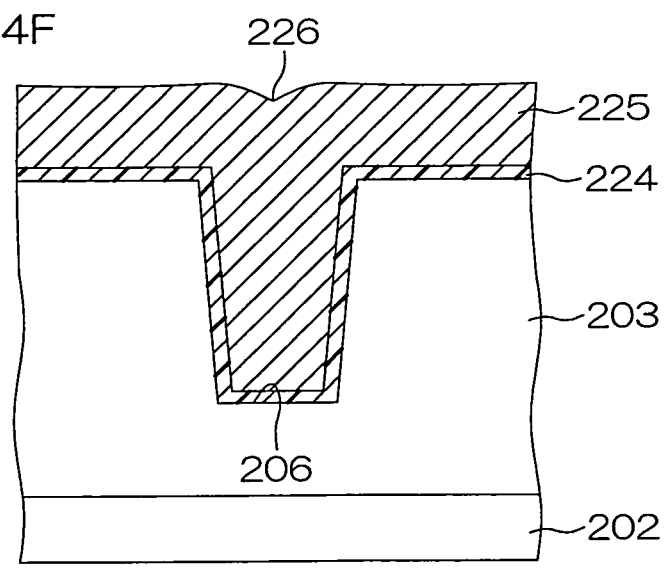
FIG. 4F is a schematic sectional view of a step subsequent to that of FIG. 4E.

Then, by a CVD method, a doped polysilicon deposition layer 225, which is a deposition layer of a doped polysilicon is formed on the oxide film 224. As shown in FIG. 4F, the doped polysilicon layer 225 completely fills the interior of the trench 206 and is also formed on the oxide film 224 outside the trench 206. Because the trench 206 is formed by digging in from the top surface of the epitaxial layer 203, a recess 226 is formed in a top surface of the doped polysilicon layer 225 at a position opposing to the trench 206.

Figure 4G:
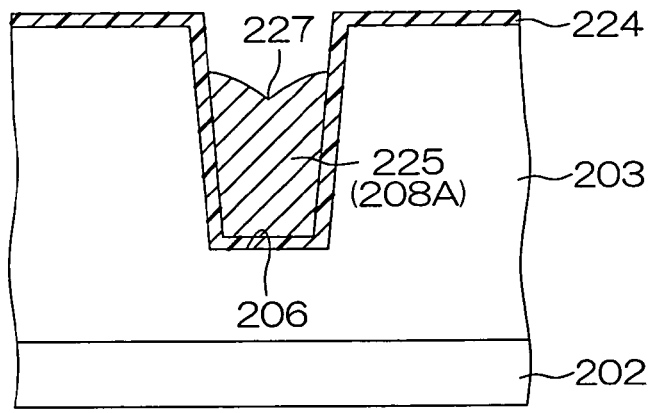
FIG. 4G is a schematic sectional view of a step subsequent to that of FIG. 4F.

A portion of the doped polysilicon layer 225 that is present outside the trench 206 is thereafter removed by etch back. As shown in FIG. 4G, a top surface (etched back surface) of the doped polysilicon layer 225 is etched back until it is lower than the top surface of the epitaxial layer 203 by a predetermined amount. The high concentration layer 208A made of the doped polysilicon is thereby obtained inside the trench 206. Due to the recess 226 formed on the top surface of the doped polysilicon layer 225, a recess 227 is formed on the top surface of the high concentration layer 208A.

Figure 4H:
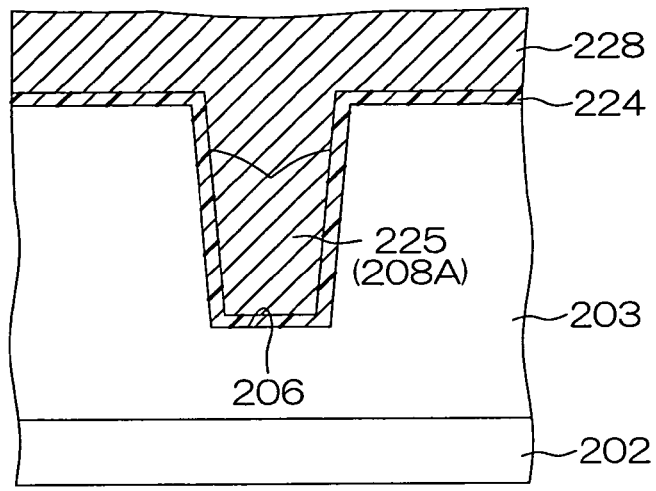
FIG. 4H is a schematic sectional view of a step subsequent to that of FIG. 4G.

Then, by a CVD method, a non-doped polysilicon layer 228, which is a deposition layer of a polysilicon that is not doped with an impurity (non-doped polysilicon) is formed on the high concentration layer 208A. As shown in FIG. 4H, the non-doped polysilicon layer 228 completely fills the interior of the trench 206 on the high concentration layer 208A and is also formed on the oxide film 224 outside the trench 206.

Figure 4I:
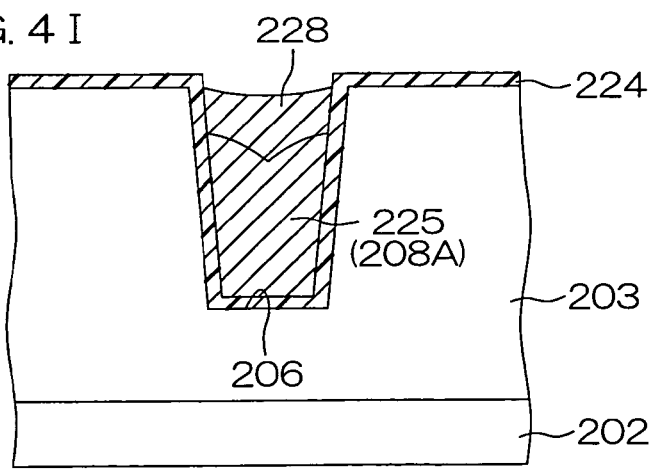
FIG. 4I is a schematic sectional view of a step subsequent to that of FIG. 4H.

A portion of the non-doped polysilicon layer 228 that is present outside the trench 206 is thereafter removed by etch back. That is, the non-doped polysilicon layer 228 is etched back until the top surface of the oxide film 224 on the epitaxial layer 203 is exposed as shown in FIG. 4I. The top surface (etched back surface) of the non-doped polysilicon layer 228 is thereby substantially flush with the top surface of the epitaxial layer 203.

Figure 4J:
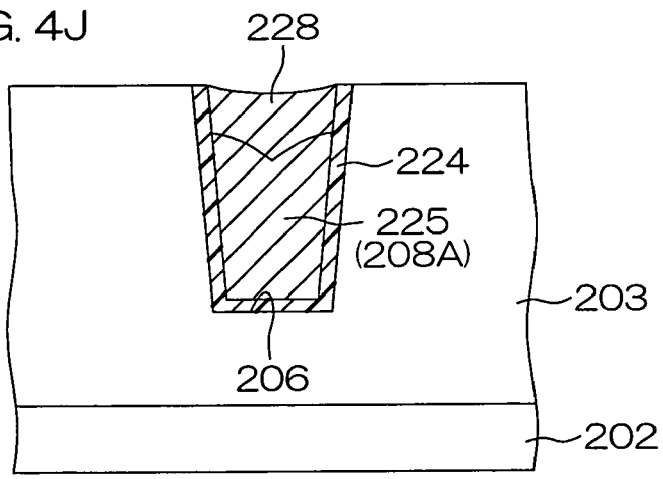
FIG. 4J is a schematic sectional view of a step subsequent to that of FIG. 4I.

Thereafter, as shown in FIG. 4J, the oxide film 224 is removed from the top surface of the epitaxial layer 203 by etching. The top surface of the epitaxial layer 203 is thereby exposed.

Figure 4K:
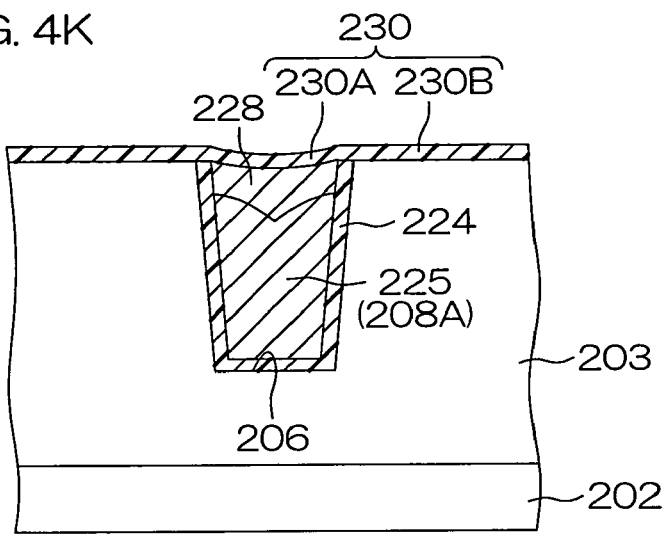
FIG. 4K is a schematic sectional view of a step subsequent to that of FIG. 4J.

Then, as shown in FIG. 4K, a sacrificial oxide film 230 is formed on the top surfaces of the epitaxial layer 203 and the top surface of the non-doped polysilicon layer 228 by a thermal oxidation process. Because an oxidation rate of the non-doped polysilicon and an oxidation rate of silicon is substantially the same, a sacrificial oxide film 230A formed on the top surface of the non-doped polysilicon layer 228, and a sacrificial oxide film 230B formed on the top surface of the epitaxial layer 203 are substantially the same in thickness.

Figure 4L:
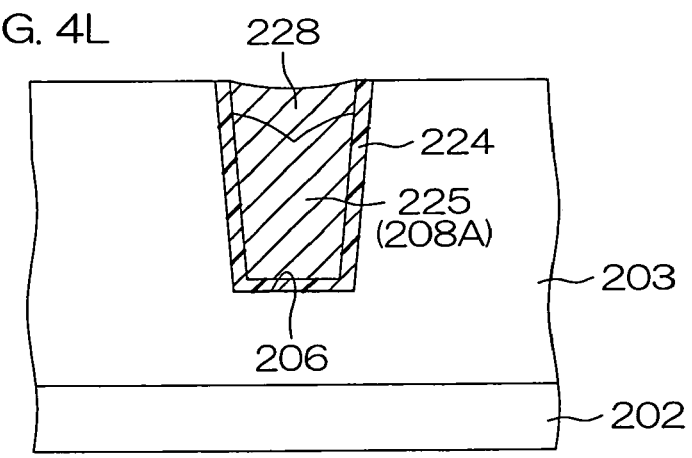
FIG. 4L is a schematic sectional view of a step subsequent to that of FIG. 4K.

Then, as shown in FIG. 4L, the sacrificial oxide film 230 formed on the top surface of the epitaxial layer 203 and the top surface of the non-doped polysilicon layer 228 is removed by etching. By the removal of the sacrificial oxide film 230, the non-doped polysilicon layer 228 develops a film thickness loss of substantially the same thickness as the epitaxial layer 203. Cleaning of the top surface of the epitaxial layer 203 is thereby achieved, and the top surface of the epitaxial layer 203 enters a satisfactory state.

Figure 4M:
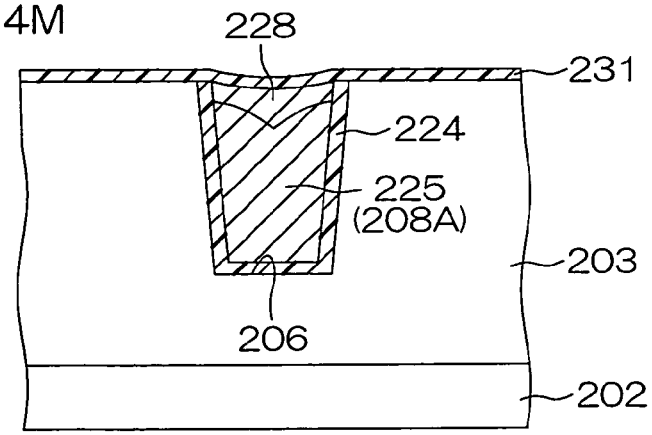
FIG. 4M is a schematic sectional view of a step subsequent to that of FIG. 4L.

Thereafter, as shown in FIG. 4M, an oxide film 231 made of $SiO_2$ is formed on the top surface of the epitaxial layer 203 and the top surface of the non-doped polysilicon layer 228 by a thermal oxidation process.

Figure 4N:
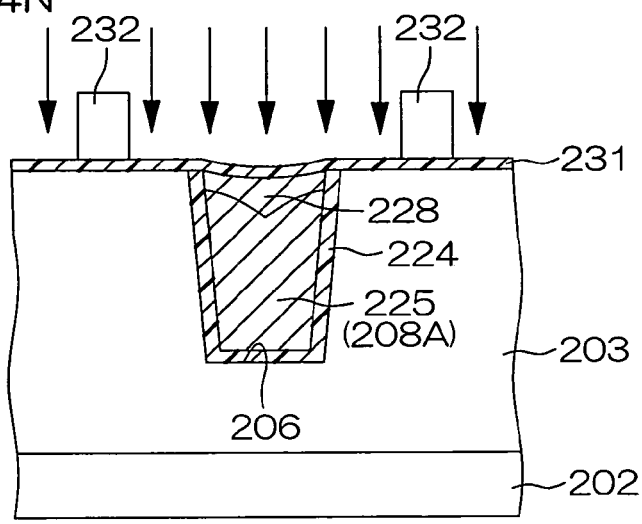
FIG. 4N is a schematic sectional view of a step subsequent to that of FIG. 4M.

Then, as shown in FIG. 4N, a mask 232 is formed on the oxide film 231, having a pattern covering portions where body contact regions 210 are to be formed. N impurity ions are then implanted onto top layer portions of the epitaxial layer 203 and onto the non-doped polysilicon layer 228 via openings of the mask 232. After the ion implantation, the mask 232 is removed.

Figure 4O:
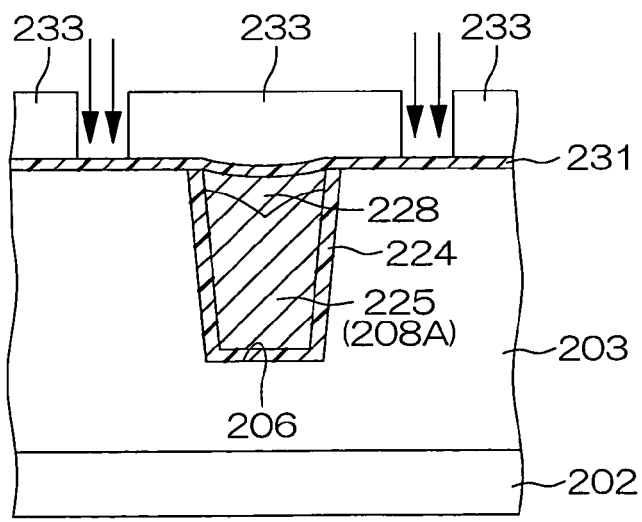
FIG. 4O is a schematic sectional view of a step subsequent to that of FIG. 4N.
Figure 5:
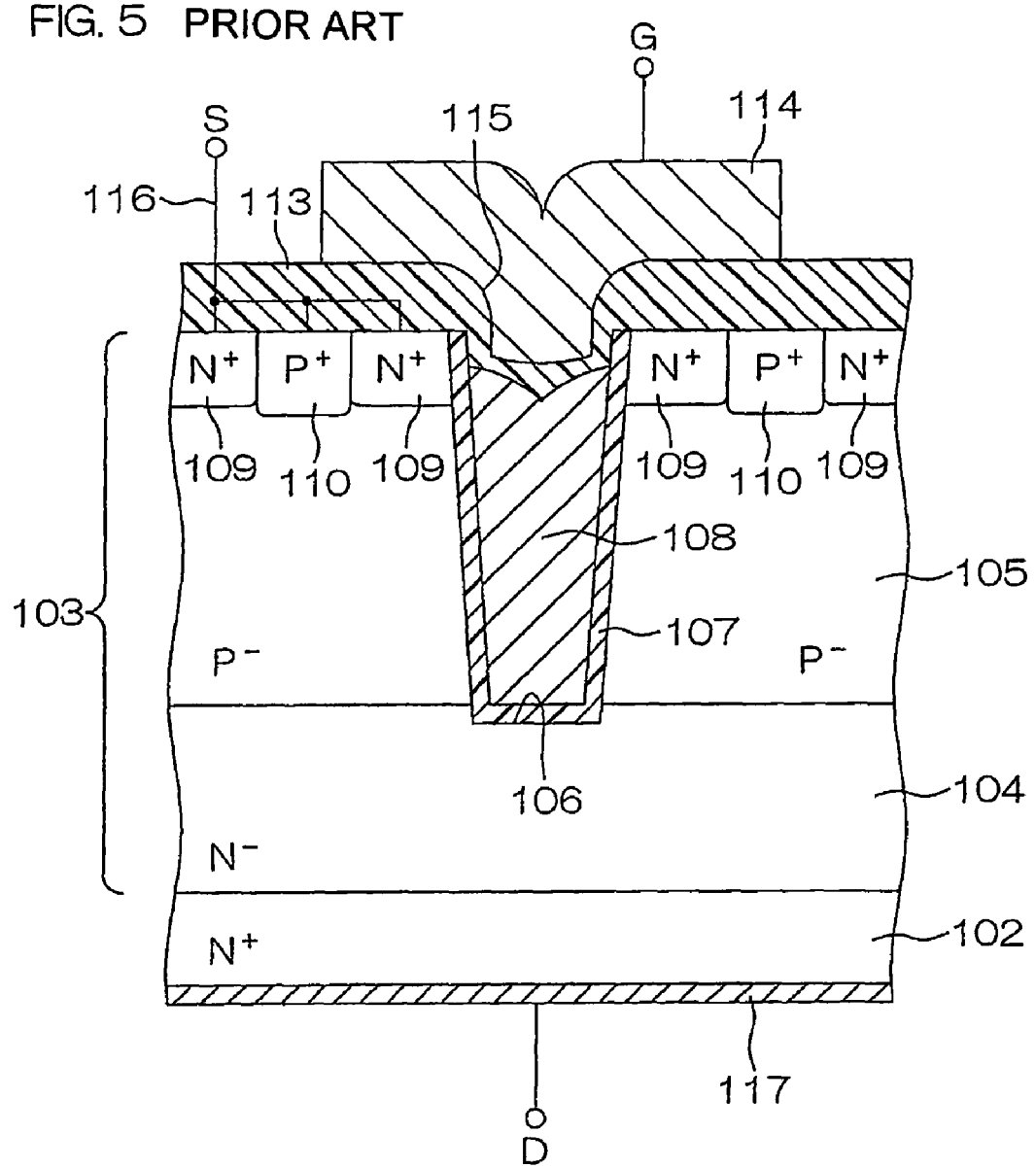
FIG. 5 is a schematic sectional view of a conventional semiconductor device including a trench gate VDMOSFET.

Furthermore, as shown in FIG. 4O, a mask 233 is formed on the oxide film 231, having openings at portions opposing to portions where the body contact regions 210 are to be formed. P impurity ions are then implanted onto top layer portions of the epitaxial layer 203 via the openings of the mask 233. After the ion implantation, the mask 233 is removed.

Thereafter, an annealing process is performed. By the annealing process, the N impurity and P impurity ions implanted onto the top layer portions of the epitaxial layer 203 are activated and the source regions 209 and the body contact regions 210 are thereby formed at the top layer portions of the epitaxial layer 203 as shown in FIG. 4P. Further, the N impurity ions implanted into the non-doped polysilicon layer 228 are activated, and the non-doped polysilicon layer 228 becomes the low concentration layer 208B as shown in FIG. 4P. The gate electrode 208 made of the high concentration layer 208A and the low concentration layer 208B is thereby obtained inside the trench 206.

After the above steps, the oxide film 231 present on the top surface of the epitaxial layer 203 is removed, and only the oxide film 224 is left on the inner surface of the trench 206, so that the gate insulating film 207 is obtained. Thereafter, the interlayer insulating film 213 having a predetermined thickness is formed on the epitaxial layer 203 by a CVD method. Then, after the contact hole 215, etc., are formed in the interlayer insulating film 213 by photolithography and etching, the gate wiring 214, the source wiring 216, and the drain electrode 217 are formed, thereby obtaining the semiconductor device 201 shown in FIG. 3.

Thus, after the doped polysilicon layer 225 and the non-doped polysilicon layer 228 are embedded successively in the trench 206 formed in the epitaxial layer 203, the respective top surfaces of the epitaxial layer 203 and the non-doped polysilicon layer 228 are cleaned. That is, the sacrificial oxide film 230 is formed on the respective top surfaces of the epitaxial layer 203 and the non-doped polysilicon layer 228, and then the sacrificial oxide layer 230 is removed. Because the oxidation rate of the non-doped polysilicon and the oxidation rate of silicon are substantially the same, the sacrificial oxide film 230A formed on the top surface of the non-doped polysilicon layer 228, and the sacrificial oxide film 230B formed on the top surface of the epitaxial layer 203 have substantially the same thickness. Thus, by removal of the sacrificial oxide film 230, the non-doped polysilicon layer 228 develops a film thickness loss of substantially the same thickness as the epitaxial layer 203. The top surface of the gate electrode 208 made of the doped polysilicon layer 225 and the non-doped polysilicon layer 228 is secure from being lower than the top surface of the epitaxial layer 203. The semiconductor device 201 can thus exhibit stable transistor characteristics without variation among transistors. The occurrence of contact failures between the gate electrode and the gate wiring can also be prevented.

Further, to embed the doped polysilicon layer 225 in the trench 206, after the doped polysilicon layer 225 of the thickness that completely fills the trench 206 is formed, the doped polysilicon layer 225 is etched back. The doped polysilicon layer 225 thus remains at the bottom portion of the trench 206 and the recess 227 is formed on the top surface of the doped polysilicon layer 225. Thereafter, the non-doped polysilicon layer 228 of the thickness that completely fills the trench 206 is formed, and the non-doped polysilicon layer 228 is etched back. No recess is formed in the top surface of the non-doped polysilicon layer 228, or even if a recess corresponding to the recess 227 in the top surface of the doped polysilicon layer 225 is formed, it is far smaller than the recess 227 in the top surface of the doped polysilicon layer 225. A large recess is thus not formed in the top surface of the non-doped polysilicon layer 228 after etch back. Because the top surface of the gate electrode 208 made of the doped polysilicon layer 225 and the non-doped polysilicon layer 228 can thus be formed to be substantially flat, occurrence of contact failures between the gate electrode 208 and the gate wiring 214 can be further prevented.

A configuration may also be employed with which the conduction types of the respective semiconductor portions of the semiconductor device 201 are inverted. That is, in the semiconductor device 201, a P type portion may be replaced by an N type portion and an N type portion may be replaced by a P type portion.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

The present application corresponds to Japanese Patent Application No. 2007-238180, filed with the Japan Patent Office on Sep. 13, 2007, and Japanese Patent Application No. 2007-238879, filed therewith on Sep. 14, 2007 and the entire disclosures of these applications are incorporated herein by reference.

What is claimed is:

1. A semiconductor device comprising:
a semiconductor layer made of silicon;
a trench extending in the semiconductor layer from a top surface of the semiconductor layer;
a gate insulating film formed on an inner wall surface of the trench and made of silicon oxide; and
a gate electrode embedded in the trench and in contact with the gate insulating film,
the gate electrode including a high concentration portion having a relatively high impurity concentration embedded at a bottom portion of the trench, and a low concentration portion formed on the high concentration portion and having a relatively low impurity concentration.

2. The semiconductor device as set forth in claim 1, further comprising a body region and a source region, the source region being formed in a top layer portion of the semiconductor layer, extending in a direction along a gate width along the trench and having a bottom portion contacting the body region.

3. The semiconductor device as set forth in claim 2, further comprising a body contact region at a central region of the source region in a direction orthogonal to the gate width, the body contact region penetrating through the source region.

4. A semiconductor device comprising a matrix of unit cells, each unit cell including the semiconductor layer, trench, gate insulating film, gate electrode, body region and source region, as set forth in claim 2, wherein on the source region, a boundary between the unit cells of said matrix that are adjacent in a direction orthogonal to the gate width is set along the source region.

5. A semiconductor device comprising a matrix of unit cells, each unit cell including the semiconductor layer, trench, gate insulating film, gate electrode, and body contact region, as set forth in claim 3, wherein the body contact region extends across two of the unit cells that are adjacent in the direction orthogonal to the gate width.

6. A semiconductor device comprising a matrix of unit cells, each unit cell including the semiconductor layer, trench, gate insulating film and gate electrode, as set forth in claim 1, wherein a boundary between unit cells of the matrix that are adjacent in the direction along a gate width is set so that the gate electrode contained in each unit cell has a fixed gate width.

7. The semiconductor device as set forth in claim 2, wherein the source region and the low concentration portion have substantially the same impurity concentration.

8. The semiconductor device as set forth in claim 1, further comprising a substrate, the semiconductor layer being provided on the substrate.

9. The semiconductor device as set forth in claim 1, wherein the impurity concentration of the high concentration portion is $10^{20}/cm^3$.

10. The semiconductor device as set forth in claim 1, wherein the impurity concentration of the low concentration portion is $10^{19}/cm^3$.

11. The semiconductor device as set forth in claim 1, wherein the impurity doped in the high concentration portion and the low concentration portion is P (phosphorus) or As (arsenic).

12. The semiconductor device as set forth in claim 1, further comprising an interlayer insulating film laminated on the semiconductor layer.

13. The semiconductor device as set forth in claim 12, further comprising a gate wiring formed on the interlayer insulating film.

14. The semiconductor device as set forth in claim 13, wherein the gate wiring contacts the gate electrode through a contact hole penetrating through the interlayer insulating film in an up/down direction.

15. The semiconductor device as set forth in claim 12, further comprising a source wiring formed on the interlayer insulating film.

16. The semiconductor device as set forth in claim 15, further comprising:
a body region and a source region, the source region being formed in a top layer portion of the semiconductor layer, extending in a direction along a gate width along the trench and having a bottom portion contacting the body region; and
a body contact region at a central region of the source region in a direction orthogonal to the gate width, the body contact region penetrating through the source region,
wherein the source wiring penetrates through the interlayer insulating film to be electrically connected to the source region and the body contact region.

17. The semiconductor device as set forth in claim 8, further comprising a drain electrode, the substrate having a first surface and a second surface opposite of the first surface, wherein the semiconductor layer is provided on the first surface, and the drain electrode is provided on the second surface.

18. The semiconductor device as set forth in claim 8, wherein the semiconductor layer and the substrate are doped with an impurity, a concentration of the impurity in the semiconductor layer being lower than in the substrate.

19. The semiconductor device as set forth in claim 18, wherein the substrate is of a first conduction type, and a first portion of the semiconductor layer is doped with a lower concentration of a first conduction type impurity than is the substrate.

20. The semiconductor device as set forth in claim 19, wherein a second portion of the semiconductor layer is doped with a second conduction type different from the first conduction type, the second portion being located on the first portion.

21. The semiconductor device according to claim 1, further comprising a gate wiring connected to a central region of a top surface of the low concentration portion.

22. The semiconductor device according to claim 21, wherein the high concentration portion has a top surface having a recess at a center thereof.

23. The semiconductor device according to claim 22, wherein the top surface of the low concentration portion is substantially flush with the top surface of the semiconductor layer.

24. The semiconductor device according to claim 1, wherein the trench has a width that expands from a bottom toward a top thereof.

* * * * *